United States Patent
Chiang et al.

(10) Patent No.: US 8,734,000 B2
(45) Date of Patent: May 27, 2014

(54) LIGHT MODULE, COMPOSITE CIRCUIT BOARD DEVICE USED THEREIN, AND ASSEMBLING METHOD THEREOF

(75) Inventors: Hsin-Chang Chiang, Hsin-Chu (TW); Chieh-Jen Cheng, Hsin-Chu (TW); Chien-Ting Liao, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 382 days.

(21) Appl. No.: 13/151,356

(22) Filed: Jun. 2, 2011

(65) Prior Publication Data

US 2012/0020096 A1 Jan. 26, 2012

(30) Foreign Application Priority Data

Jul. 20, 2010 (TW) .............................. 99123747 A

(51) Int. Cl.
*F21V 7/04* (2006.01)
(52) U.S. Cl.
USPC .......................................... 362/631; 362/646
(58) Field of Classification Search
USPC ................ 362/631, 646; 439/56, 77, 82, 495; 361/7, 749, 792
See application file for complete search history.

(56) References Cited

U.S. PATENT DOCUMENTS

| | | | |
|---|---|---|---|
| 6,452,754 B1 | 9/2002 | Mizuta et al. | |
| 2005/0195578 A1* | 9/2005 | Chang et al. | 361/749 |
| 2006/0091498 A1 | 5/2006 | Sriram et al. | |
| 2008/0045077 A1* | 2/2008 | Chou | 439/495 |

FOREIGN PATENT DOCUMENTS

| | | |
|---|---|---|
| CN | 1539184 | 10/2004 |
| CN | 1805656 A | 7/2006 |
| CN | 200510101217.2 | 5/2007 |
| CN | 101737676 A | 6/2010 |
| CN | 101739910 A | 6/2010 |
| CN | 101788736 A | 7/2010 |
| TW | 200618202 | 6/2006 |
| WO | 03047050 A1 | 6/2003 |

OTHER PUBLICATIONS

China Office Action dated Oct. 25, 2011.
English translation of pertinent parts of CN 1805656 A.
English translation of abstract of CN 1805656 A.
English translation of abstract of CN 1539184 A.
Taiwan Office Action dated Dec. 26, 2012.
English translation of abstract of CN 101737676 A.
English translation of abstract of CN 101788736 A.
English translation of abstract of CN 101739910 A.
English translation of abstract of CN 200510101217.2.

* cited by examiner

*Primary Examiner* — Y My Quach Lee
(74) *Attorney, Agent, or Firm* — McClure, Qualey & Rodack, LLP

(57) ABSTRACT

A light module and an assembling method thereof are disclosed. The light module includes a first circuit board, a second circuit board, and a light source, wherein the first circuit board has a first opening and a second opening, and the second circuit board has a first bending portion. The light source is disposed on the first circuit board. The second circuit board passes through the first opening and the second opening of the first circuit board to form the first bending portion and the first circuit board and the second circuit board are fixed together to complete the light module assembling.

16 Claims, 7 Drawing Sheets

LIGHT MODULE, COMPOSITE CIRCUIT BOARD DEVICE USED THEREIN, AND ASSEMBLING METHOD THEREOF

BACKGROUND OF THE INVENTION

1. Field of the Invention

The present invention generally relates to a light module and an assembling method thereof. Particularly, the present invention relates to a light module with increased reliability and an assembling method thereof.

2. Description of the Prior Art

Conventional cathode-ray tube display devices, under current trends of pursuing shorter, smaller, lighter, and thinner electronic devices, are gradually being replaced by flat panel display devices that have advantageous properties such as smaller volume, low power consumption, as well as other desirable characteristics. As a result, flat panel display devices are becoming or have already become the de facto standard for the market of display devices.

There are various types of flat panel display devices on the market. Among them, liquid crystal display (LCD) devices utilizing liquid crystal display technology are currently the most favored among manufacturers and customers. In addition, the application of LCD technologies in other products on the market is also far reaching, wherein examples of products with LCD technologies including computer display devices, LCD televisions, digital billboards, tablet computers, and other related devices are all gradually becoming commonplace. However, due to the fact that LCD devices are non self-luminous display devices, the LCD devices therefore need backlight units to provide the required light for purposes of illuminating the display. In recent years, in accordance with raising public awareness of environmentally friendly practices as well as other technical considerations, the light component of backlight sources have gradually gravitated towards utilizing light emitting diodes (LED) as light sources. Typically, light emitting diodes are disposed on printed circuit boards to form a LED light bar within backlight sources. In addition, LED light bars are electrically connected to external circuits through flexible printed circuit boards (PCB) so that the lighting mechanism of the backlight source may be controlled by the external circuits.

As shown in FIG. 1A, a conventional backlight module of a LCD device includes a light module 60 composed of a light bar of light emitting diodes and a flexible printed circuit board, a light shade 70 for accommodating the light bar, a plurality of optical films 80, and a bottom frame 40. As shown in FIG. 1B of a conventional light module, the conventional light module includes a first circuit board 10, a second circuit board 20, and a light source 30, wherein the light source 30 is disposed on and electrically connected to the first circuit board 10. The flexible second circuit board 20 is also electrically connected to the first circuit board 10. Since the second circuit board 20 is electrically connected to the first circuit board 10, external circuits can transmit circuit control signals to the light source 30 that is disposed on the first circuit board 10 by way of the second circuit board 20. As shown in FIG. 1B, after the first circuit board 10 is electrically connected to the second circuit board 20, the flexible second circuit board 20 will bend around the top of the first circuit board 10 and wind around the back of the first circuit board 10. An end of the second circuit board 20 then winds around the bottom of the first circuit board 10 towards the front. Therefore, through the property of the second circuit board 20 of being able to wind around the first circuit board 10, the first circuit board 10 and the second circuit board 20 can be fixed to each other. As shown in FIG. 1C, in addition to utilizing the second circuit board 20 to wind around the first circuit board 10 to fix them together, a tape 50 is also utilized to increase the fixation effect between the two circuit boards, wherein the tape 50 fixes the two circuit boards together in both the horizontal and vertical directions.

However, during the follow-up assembling process of disposing the first circuit board 10 that has the light source 30 within the light shade 70, the second circuit board 20 winding around the first circuit board 10 may be damaged by influences from the assembling action or even the light shade 70. In turn, the damage caused to the second circuit board 20 will affect the quality of the electrical connection between the second circuit board 20 and external circuits or between the second circuit board 20 and the first circuit board 10, resulting in symptoms of faulty lighting in the light source 30 and subsequently decreased reliability of the light module as a whole.

SUMMARY OF THE INVENTION

It is an object of the present invention to provide a light module and an assembling method thereof to decrease the likelihood of faulty lighting from occurring within the light module.

It is another object of the present invention to provide a light module and an assembling method thereof that has the effect of increasing the product yield.

The light module of the present invention includes a first circuit board, a second circuit board, and a light source. The first circuit board includes a first opening, a second opening, a first connection portion, and a surface, wherein the light source is disposed on the surface of the first circuit board and is electrically connected to the first connection portion that is disposed on the surface. The second circuit board has a first bending portion, a second bending portion, and a second connection portion, wherein the second connection portion is electrically connected to the first connection portion of the first circuit board to allow external circuits to be connected to the light source through the second connection portion of the second circuit board, thereby allowing the external circuits to control the mechanism and time of lighting of the light source.

The second circuit board of the present invention is flexible, allowing the second circuit board to pass through the first opening of the first circuit board and then be folded at the opening of the first opening of the first circuit board to form the first bending portion on the second circuit board, wherein the first bending portion is accommodated in the first opening of the first circuit board. By passing one end of the second circuit board through the first opening to form the first bending portion, the end of the second circuit board that has already passed through the first opening may come in contact with the first circuit board or lay parallel to the surface of the first circuit board. In the light module of the present invention, the flexible second circuit board passes through the second opening to form a second bending portion, wherein the second bending portion is accommodated in the second opening of the first circuit board and the first bending portion is disposed between the second bending portion and the second connection portion. By passing the second circuit board through the second opening to form the second bending portion, the portion of the second circuit board that has passed through the second opening may be allowed to pass out of the surface of the first circuit board. Therefore, by way of passing the second circuit board through the first opening and the second opening of the first circuit board to form the first bending portion, the first circuit board and the second circuit board may be fixed to each other.

The light module assembling method includes the following steps of providing a first circuit board that has a first connection portion, a first opening, and a second opening disposed on a surface and providing a second circuit board that has a second connection portion. A light source is provided on the surface of the first circuit board and electrically connected to the first connection portion. The second connection portion of the second circuit board is then electrically connected to the first connection portion of the first circuit board to allow external circuits to electrically connect to the light sources disposed on the first circuit board through the second connection portion of the second circuit board in order to control the lighting mechanism of the light source. Thereafter, an end of the second circuit board connected to the first circuit board is passed through the first opening of the first circuit board and folded to form a first bending portion, wherein the first bending portion is accommodated in the first opening and an end of the second circuit board that has already passed through the first opening is laying parallel to or is contacting the first circuit board. Then, the end of the second circuit board connecting to the first circuit board passes through the second opening of the first circuit board to enable one end of the second circuit board passing through the second opening to penetrate out of the surface of the first circuit board.

Due to the fact that during the step of passing the second circuit board through the first and second openings of the first circuit board causes the first circuit board and the second circuit board to be fixed to each other, no adhesive tape is therefore required to fix the two circuit boards together. In addition, since the second circuit board does not wrap around the outer edges of the first circuit board, damages to the second circuit board that may occur during the follow-up assembling procedure of disposing the light module in the light shade may be minimized. As a result, the success rate of the procedure of the external circuits controlling the light source through the second circuit board can be raised to achieve the effect of increasing reliability of the light module.

DETAILED DESCRIPTION OF THE PREFERRED EMBODIMENT

The present invention provides a light module and an assembling method thereof. The light module includes a first circuit board, a second circuit board, and a light source. The light module assembling method includes bending the second circuit board to form a first bending portion to allow the second circuit board to pass through a first opening and a second opening of the first circuit board.

Figure 1A:
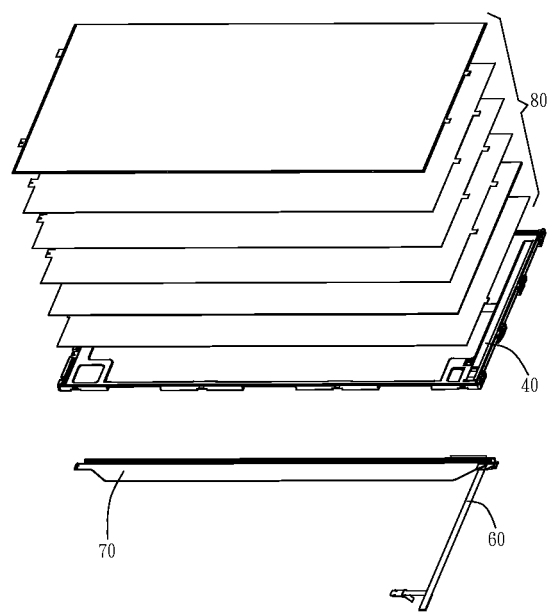
FIG. 1A is an exploded view of the conventional backlight module.
Figure 1B:
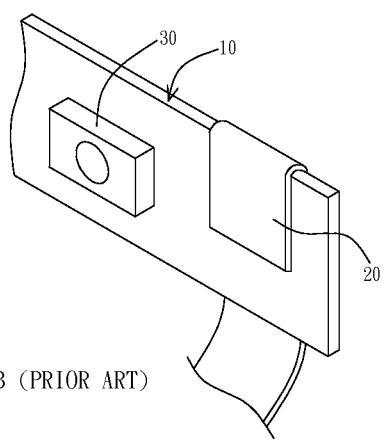
FIG. 1B is a perspective view of the conventional light module.
Figure 1C:
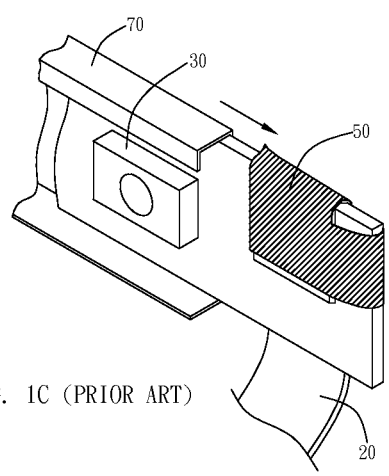
FIG. 1C is a perspective view of the conventional light module assembling device.
Figure 2A:
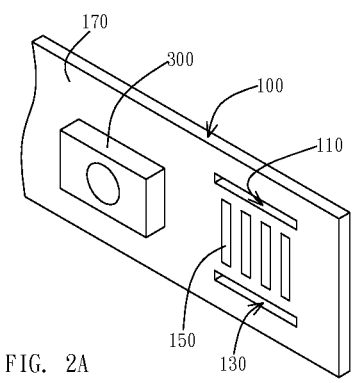
FIG. 2A is a perspective view of an embodiment of the first circuit board of the light module of the present invention.

As shown in FIG. 2A, in an embodiment of the present invention, on one end of the first circuit board 100, the first circuit board 100 has the first opening 110, the second opening 130, and a first connection portion 150. The first circuit board 100 also has a surface 170. As shown in FIG. 2A, the first connection portion 150 is disposed on the surface 170 of the first circuit board 100. The first opening 110 and the second opening 130 are disposed on either sides of the first connection portion 150 respectively. In the present embodiment, the first circuit board 100 is preferably a rigid printed circuit board (PCB). Whereas, the first connection portion 150 of the first circuit board 100 is preferably formed of a conductive material such as copper or aluminum to provide a basis for electric connections. In the embodiment illustrated in FIG. 2A, the first opening 110 and the second opening 130 are long narrow close-ended openings extending along the direction of the long side of the first circuit board 100. In the present embodiment, close-ended opening refers to, when the first circuit board 100 is viewed from a perspective facing the surface 170, the long narrow opening-holes of the first opening 110 and the second opening 130 that are enclosed by the first circuit board 100 throughout the openings. In other words, close-ended opening refers to a complete hole that penetrates through the first circuit board 100 and which is surrounded by the first circuit board 100 throughout the hole without any 'open ends' extending outward to the edge boundaries of the first circuit board 100 that may open the hole up to be outside the edge boundaries of the first circuit board 100. As shown in FIG. 2A, the light source 300 is disposed on the surface 170 of the first circuit board 100 and is electrically connected to the first connection portion 150 through internal circuits (not shown) in the first circuit board 100. In the present embodiment, the light source 300 is a light-emitting diode (LED), wherein a circuit driver may be utilized to control the lighting mechanism and the LED has energy and space conserving merits. In the diagram of the present embodiment, only one light-emitting diode is illustrated as an example; however, those skilled in the respective arts all know that there could be a plurality of light-emitting diodes.

Figure 2B:
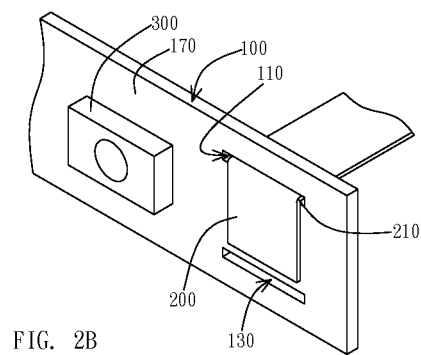
FIG. 2B is a perspective view of the light module.
Figure 2C:
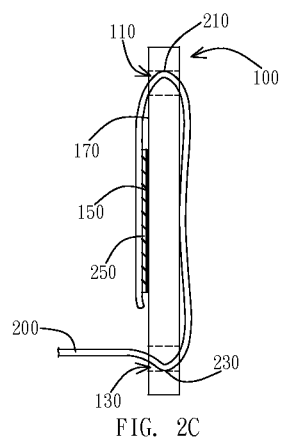
FIG. 2C is a side view of the light module.

In the present embodiment, at a terminal end of the second circuit board 200 is a second connection portion 250, as shown in FIG. 2C, for purposes of electrically connecting to the first circuit board 100. The second connection portion 250 is preferably formed of conductive materials such as copper or aluminum. In the embodiment shown in FIG. 2C, the first connection portion 150 of the first circuit board 100 and the second connection portion 250 of the second circuit board 200 are electrically connected to each other to allow the second circuit board 200 to transmit a control signal from an external circuit to the first circuit board 100. In this manner, the external circuit can control the lighting mechanism of the light source 300 by transmitting the control signal through the second circuit board 200 to the light source 300 on the first circuit board 100. In the present embodiment, the first connection portion 150 and the second connection portion 250 may be electrically connected through hot-pressing, soldering, or any other soldering technology to achieve the electrical connection.

As shown in FIG. 2B, after connecting with the first circuit board 100, one end of the second circuit board 200 passes through the first opening 110 of the first circuit board 100 to form a first bending portion 210 which is accommodated in the first opening 110 of the first circuit board 100. It can be seen from this that the width of the second circuit board 200 is preferably smaller than the width of the first opening 110. In the present embodiment, the second circuit board 200 is a flexible/soft printed circuit board (PCB). The flexible nature of the PCB allows the second circuit board 200 to form the first bending portion 210 by folding at the two sides of the first opening 110.

As shown in the embodiment of FIG. 2C, the first opening 110 and the second opening 130 are respectively disposed above and below the first connection portion 150 of the first circuit board 100. When one end of the second circuit board 200 passes through the first opening 110 to form the first bending portion 210, the first bending portion 210 will be accommodated in the first opening 110 and will enable the second circuit board, by way of the folding action, to contact the backside of or be parallel to the first circuit board 100 (in other words, contacting or being parallel to the opposite side of the surface 170). In the present embodiment, the second circuit board 200 has a second bending portion 230, wherein the first bending portion 210 is disposed between the second connection portion 250 and the second bending portion 230. As shown in FIG. 2C, the second circuit board 200 forms the second bending portion 230 in the second opening 130 when the second circuit board 200 passes through the second opening 130. The portion of the second circuit board 200 passing through the first opening 110 is then passed through the second opening 130 to form the second bending portion 230 and extends out of the surface 170 of the first circuit board 100.

Figure 2D:
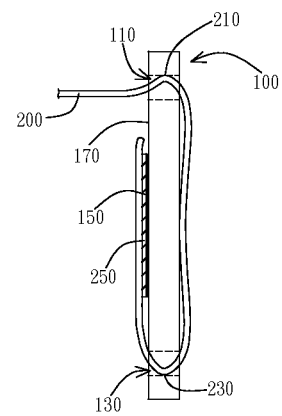
FIG. 2D is a side view e of another embodiment of the light module.

As shown in an embodiment in FIG. 2D, the second circuit board 200 is passed through the first opening 110 and the second opening 130 of the first circuit board 100 to form the first bending portion 210 and the second bending portion 230 respectively. In the present embodiment, after the second circuit board 200 has passed through the second opening 130 that is below the first connection portion 150, the second circuit board 200 will end up on top of the first connection portion 150. That is, the portion of the second circuit board 200 that extends out of the surface 170 of the first circuit board 100 and connects the first opening 110 is located above the first connection portion 150.

Figure 3A:
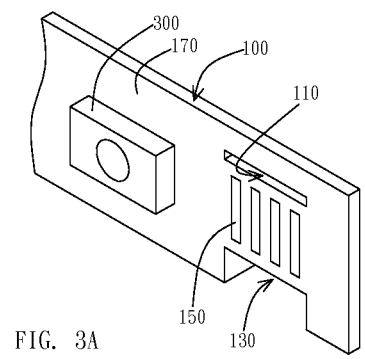
FIG. 3A is a perspective view of another embodiment of the first circuit board of the light module of the present invention.
Figure 3B:
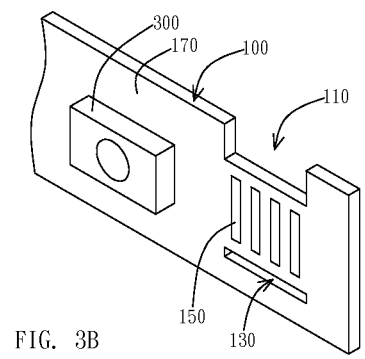
FIG. 3B is a perspective view of another embodiment of the first circuit board of the light module of the present invention.

As shown in an embodiment in FIG. 3A, the first opening 110 of the first circuit board 100 is a close-ended opening while the second opening 130 is an open-ended opening, wherein the open-ended opening refers to the opening-hole formed on the first circuit board 100 or a cavity recessed into one side of the first circuit board 100. The open-ended opening displays curvatures extending inward at the edge boundaries of the opening-hole. In the present embodiment, the second opening 130 is an open-ended opening extending inward on the bottom edge of the first circuit board 100. When the second opening 130 is an open-ended opening and after the second circuit board 200 passes through the first opening 110, an end of the second circuit board 200 can be wound around the bottom of the first circuit board 100 in between the open space of the open-ended second opening 130 so that a portion of the second circuit board 200 may be accommodated in the open space of the second opening 130 without having to specifically pass the second circuit board 200 through a hole like in the previous embodiment. Through such a configuration, the assembling efficiency may be increased. As shown in an embodiment in FIG. 3B, the first opening 110 of the first circuit board 100 is an open-ended opening while the second opening 130 is a close-ended opening. In the present embodiment, as shown in FIG. 3B, the first opening 110 starts from the top of the first circuit board 100 and extends inward into the first circuit board 100 to form an open-ended opening. When the first opening 110 is an open-ended opening, the second circuit board 200 may be wound around the first circuit board 100 from the top, through the open space of the first opening 110 to form the first bending portion 210. The second circuit board 200 may then be passed through the close-ended opening of the second opening 130. Through such a configuration, the assembling time may be decreased while also simultaneously achieving the effect of fixing the second circuit board 200 to the first circuit board 100 together.

Figure 4A:
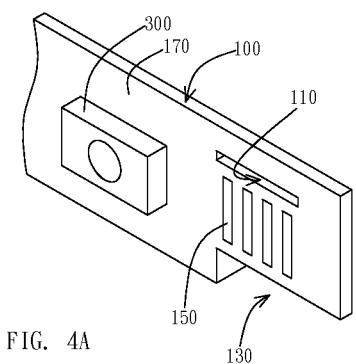
FIG. 4A is a perspective view of another embodiment of the first circuit board of the light module of the present invention.
Figure 4B:
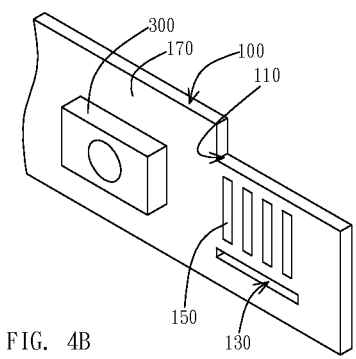
FIG. 4B is a perspective view of another embodiment of the first circuit board of the light module of the present invention.

In an embodiment shown in FIG. 4A, the first opening 110 of the first circuit board 100 is a close-ended opening while the second opening 130 is an open-ended opening. In the present embodiment, the second opening 130 extends inward from a bottom edge and an adjacent edge thereof of the first circuit board 100. When the second opening 130 is an open-ended opening, end of the second circuit board 200 may be wound around the first circuit board 100 from a side or bottom of the first circuit board 100 through the open-ended opening so that the second circuit board 200 may be accommodated within the space of the second opening 130. Through such a configuration, by reducing the time needed to specifically pass the second circuit board 200 through a close-ended opening, the assembling time may be decreased overall. Simultaneously, since the second opening 130 is an opening extending inward into the first circuit board 100 from the bottom and the adjacent edge thereof, an end of the second circuit board 200 will not be affected by the width of the second opening 130 and hence not be restricted to only being accommodated within an opening of a specific width. Through such a configuration, in the follow-up assembling process, the convenience and adjustability of the position of the electrical connection between the second circuit board 200 and an external circuit may be increased. In an embodiment shown in FIG. 4B, the first opening 110 of the first circuit board 100 is an open-ended opening while the second opening 130 is a close-ended opening. In the present embodiment, the first opening 110 is an open-ended opening extending inward into the first circuit board 100 from a top edge and an adjacent edge thereof of the first circuit board 100. When the first opening 110 is an open-ended opening, an end of the second circuit board 200 may be wound around the first circuit board 100 through the space of the open-ended opening of the first opening 110 from over the corresponding top or adjacent side edge thereof so that the first bending portion 210 may be accommodated within the space of the first opening 110. Through such a configuration, the assembling time may be decreased to increase the overall efficiency of the assembling process.

Figure 5:
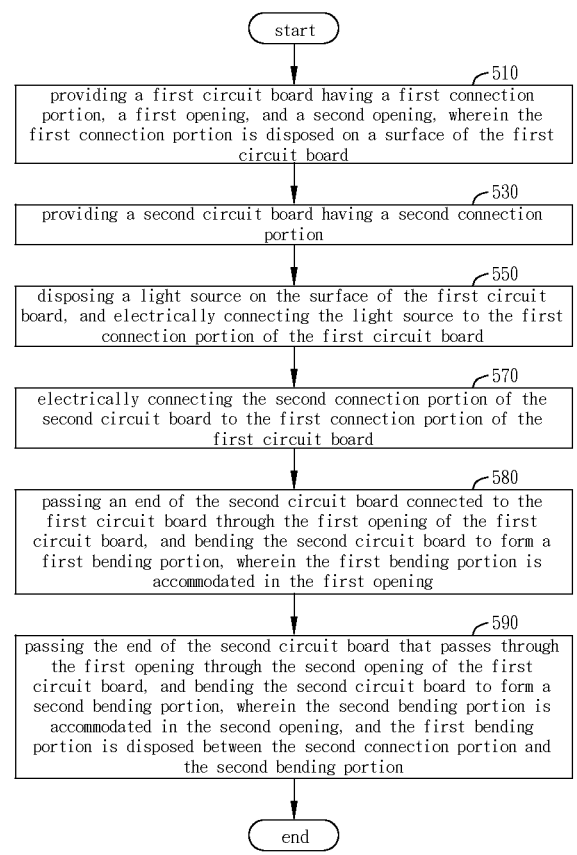
FIG. 5 is a flowchart diagram of the light module assembling method of the present invention.

Shown in FIG. 5 is an embodiment of the light module device assembling method of the present invention. Step 510 involves providing a first circuit board having a first connection portion, a first opening, and a second opening, wherein the first connection portion is disposed on a surface of the first circuit board. In the present embodiment, the first circuit board 100 is a rigid printed circuit board (PCB) while the first connection portion 150 of the first circuit board 100 is formed of a conductive material such that the first connection portion 150 may be utilized for electrical connections, wherein the first connection portion 150 is disposed on the surface 170 of the first circuit board 100. Examples of conductive materials for the first connection portion 150 may include but is not limited to copper and aluminum. In the present step, opening/slot-forming technology may be utilized on the first circuit board 100 to separately form the first opening 110 and second opening 130 penetrating through the first circuit board 100. Step 530 involves providing a second circuit board having a second connection portion. In the present embodiment, the second circuit board 200 is a flexible/soft printed circuit board such as a flexible PCB, wherein the second connection portion 250 is formed of a conductive material that may include but is not limited to copper and aluminum.

In the embodiment shown in FIG. 5, step 550 involves disposing a light source on the surface of the first circuit board, and electrically connecting the light source to the first connection portion. In the present step, the light source 300 is disposed on the surface 170 of the first circuit board 100 to electrically connect the light source 300 to the first connection portion 150. In this manner, external circuits may control the lighting mechanism of the light source 300 through the first connection portion 150 of the first circuit board 100. Step 570 involves electrically connecting the second connection portion of the second circuit board to the first connection portion of the first circuit board. In the present step, hot-pressing, solder joints, or soldering technologies may be utilized to connect the first connection portion 150 to the second connection portion 250 in order to achieve the effect of an electrical connection, and thus enable external circuits to control the lighting mechanism of the light source 300 of the first circuit board 100 through such an electrical connection.

In the embodiment shown in FIG. 5, step 580 involves passing an end of the second circuit board connected to the first circuit board through the first opening of the first circuit board, and bending the second circuit board to form a first bending portion, wherein the first bending portion is accommodated in the first opening. In the present step, the end of the second circuit board 200 connected to the first circuit board 100 is passed through the first opening 110 of the first circuit board 100, and the second circuit board 200 is bent to form the first bending portion 210 to enable the second circuit board 200 to come in contact with the backside of the first circuit board 100, wherein the backside corresponds to the opposite side of the surface 170 on which the light source 300 is disposed.

Step 590 involves passing the end of the second circuit board that passes through the first opening through the second opening of the first circuit board, and bending the second circuit board to form a second bending portion, wherein the second bending portion is accommodated in the second opening, and the first bending portion is disposed between the second connection portion and the second bending portion. In the present step, the end of the flexible second circuit board 200 is passed through the second opening 130 of the first circuit board 100 to allow the second circuit board 200 that has passed through the second opening 130 to penetrate out of the surface 170 where the light source 300 is disposed. Thus, accordingly to steps 580 and 590, the second circuit board 200 can be passed through the first opening 110 and the second opening 130 of the first circuit board 100 to complete the assembling process of fixing the two circuit boards together in order to increase the lighting reliability of the light source 300 by decreasing the damage done to the second circuit board 200 during the follow-up assembling process.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A composite circuit board device, comprising:
   a first circuit board comprising a first opening, a second opening, and a first connection portion, wherein the first opening and the second opening respectively penetrate through the first circuit board, and the first connection portion is disposed on a surface of the first circuit board; and
   a second circuit board having a first bending portion, a second bending portion, and a second connection portion electrically connected to the first connection portion, wherein the second circuit board passes through the first opening and the second opening of the first circuit board, the first bending portion is accommodated in the first opening and the second bending portion is accommodated in the second opening, the first bending portion is disposed between the second connection portion and the second bending portion toward the second bending portion to allow the second circuit board to fold backwards at the first bending portion.

2. The composite circuit board device of claim 1, wherein the first opening and the second opening are both close-ended openings.

3. The composite circuit board device of claim 1, wherein the first opening is a close-ended opening, and the second opening is an open-ended opening.

4. The composite circuit board device of claim 1, wherein the first opening is an open-ended opening, and the second opening is a close-ending opening.

5. The composite circuit board device of claim 1, wherein the first connection portion of the first circuit board is disposed between the first opening and the second opening.

6. A light module, comprising:
   a first circuit board comprising a first opening, a second opening, and a first connection portion, wherein the first opening and the second opening respectively penetrate through the first circuit board, and the first connection portion is disposed on a surface of the first circuit board;
   a second circuit board having a first bending portion, a second bending portion, and a second connection portion electrically connected to the first connection portion, wherein the second circuit board passes through the first opening and the second opening of the first circuit board, the first bending portion is accommodated in the first opening and the second bending portion is accommodated in the second opening, and the first bending portion is disposed between the second connection portion and the second bending portion to allow the second circuit board to fold backwards at the first bending portion toward the second bending portion; and
   a light source disposed on the surface of the first circuit board and electrically connected to the first connection portion.

7. The light module of claim 6, wherein the first opening and the second opening are both close-ended openings.

8. The light module of claim 6, wherein the first opening is a close-ended opening, and the second opening is an open-ended opening.

9. The light module of claim 6, wherein the first opening is an open-ended opening, and the second opening is a close-ended opening.

10. The light module of claim 6, wherein the first connection portion of the first circuit board is disposed between the first opening and the second opening.

11. A light module assembling method, comprising:
providing a first circuit board having a first connection portion, a first opening, and a second opening, wherein the first connection portion is disposed on a surface of the first circuit board;
providing a second circuit board having a second connection portion;
disposing a light source on the surface of the first circuit board, and electrically connecting the light source to the first connection portion;
electrically connecting the second connection portion of the second circuit board to the first connection portion of the first circuit board;
passing an end of the second circuit board connected to the first circuit board through the first opening of the first circuit board, and bending the second circuit board to form a first bending portion, wherein the first bending portion is accommodated in the first opening; and
passing the end of the second circuit board that passes through the first opening through the second opening of the first circuit board, and bending the second circuit board to form a second bending portion, wherein the second bending portion is accommodated in the second opening, and the first bending portion is disposed between the second connection portion and the second bending portion.

12. The light module assembling method of claim 11, wherein the first opening and the second opening are both close-ended openings.

13. The light module assembling method of claim 11, wherein the first opening is a close-ended opening, the second opening is an open-ended opening.

14. The light module assembling method of claim 11, wherein the first opening is an open-ended opening, the second opening is a close-ended opening.

15. The light module assembling method of claim 11, wherein the first connection portion of the first circuit board is disposed between the first opening and the second opening.

16. A light module, comprising:
a first circuit board comprising a first opening and a second opening, wherein the first opening and the second opening respectively penetrate through the first circuit board;
a second circuit board having a first bending portion and a second bending portion, wherein the second circuit board passes through the first opening perpendicular to the first circuit board and passes through the second opening of the first circuit board, and the first bending portion is accommodated in the first opening and the second bending portion is accommodated in the second opening such that the second circuit board folds backwards at the second bending portion toward the first bending portion; and
a light source disposed on the first circuit board.

* * * * *